(12) United States Patent
Grochowski et al.

(10) Patent No.: US 7,020,590 B2
(45) Date of Patent: Mar. 28, 2006

(54) SIMULATION OF DI/DT-INDUCED POWER SUPPLY VOLTAGE VARIATION

(75) Inventors: Edward T. Grochowski, San Jose, CA (US); David J. Ayers, Fremont, CA (US); Vivek Tiwari, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 689 days.

(21) Appl. No.: 10/041,062

(22) Filed: Dec. 28, 2001

(65) Prior Publication Data

US 2003/0125923 A1    Jul. 3, 2003

(51) Int. Cl.
*G06F 17/50* (2006.01)
*G06F 13/00* (2006.01)

(52) U.S. Cl. .............................. 703/2; 703/22; 702/57; 713/322; 713/323

(58) Field of Classification Search .................... 703/2, 703/22, 18; 702/57, 39; 714/37; 713/322, 713/323
See application file for complete search history.

(56) References Cited

U.S. PATENT DOCUMENTS

| | | | | |
|---|---|---|---|---|
| 4,868,773 A | * | 9/1989 | Coyle et al. | 708/304 |
| 5,317,525 A | * | 5/1994 | Taoka et al. | 703/18 |
| 6,125,334 A | * | 9/2000 | Hurd | 702/60 |
| 6,820,222 B1 | * | 11/2004 | Swoboda | 714/33 |

* cited by examiner

*Primary Examiner*—Thai Phan
(74) *Attorney, Agent, or Firm*—Michael J. Nesheiwat

(57) ABSTRACT

A mechanism is disclosed for determining a voltage at a device in a power delivery network. The mechanism includes determining an impulse response for the power delivery network, and tracking the current consumed by the device as it operates over a sequence of clock cycles. The activity profile is filtered using a representation of the impulse response to provide a profile of the voltages at the device.

7 Claims, 13 Drawing Sheets

“SIMULATION OF DI/DT-INDUCED POWER SUPPLY VOLTAGE VARIATION”

BACKGROUND OF THE INVENTION

1. Technical Field

The present invention relates to power supplies and, in particular, to mechanisms for modeling the rate at which power supply voltages change in response to the current demands of integrated circuits.

2. Background Art

Over the past 25 years, power consumption by integrated circuits such as microprocessors, has grown from under one watt to over 100 watts. The dramatic increase in power is a result of transistor scaling, which has produced many more transistors on a chip running at much higher frequencies. Traditionally, voltage scaling has been used to reduce power to manageable levels. However, with supply voltages approaching one volt, further large reductions in voltage are not likely to provide additional power reduction. The following discussion focuses on microprocessors, but it will be recognized that any integrated circuits operating at high frequencies and subject to varying work loads will be subject to the similar problems.

A microprocessor that consumes 100 W requires a power supply, voltage regulator, and power distribution network capable of supplying 100 W, as well as a thermal solution (package, heat sinks, and fans) capable of dissipating the resulting heat. Such components are costly and cannot be expected to scale to higher power levels as transistor dimensions shrink.

In addition to the absolute power levels, changes in power levels are problematic. In particular, current fluctuations associated with rapid changes in power level can cause the voltage seen by a device to move outside a specified range. A hypothetical 100 W microprocessor running at 1.0V draws 100 A. To ensure proper circuit operation, a voltage regulator and power distribution network must maintain the supply voltage to within ±/−5%. This means that no more than 100 mV peak-to-peak ripple can be tolerated regardless of what the microprocessor (or the software it is running) does. An ideal power distribution network will have sufficient capacitance, and small enough inductance and resistance, to maintain the supply voltage to within 100 mV even though the microprocessor's supply current may change dramatically within a few nanoseconds. This latter problem is referred to as the di/dt problem after the definition of inductance, $V=L \cdot di/dt$. V is the voltage across an inductor of value L when subject to a change in current di/dt. Practical power distribution networks do not currently provide these ideal characteristics.

Mitigating the effects of di/dt on voltage levels becomes increasingly difficult as power management techniques, like clock-gating, are deployed in microprocessor designs. For example, a power-hungry unit, such as the floating-point execution unit, may be equipped with a circuit that turns on the clock when the unit is active and shuts off the clock when the unit is inactive. Clock gating may be implemented with extremely fine granularity—unit by unit and pipestage by pipestage—resulting in a large number of clock gating signals. This technique minimizes power consumption in inactive units, but it results in large variations in overall power levels that depend on the software being run.

The present invention addresses these and other problems associated with power delivery networks.

BRIEF DESCRIPTION OF THE DRAWINGS

The present invention may be understood with reference to the following drawings, in which like elements are indicated by like numbers. These drawings are provided to illustrate selected embodiments of the present invention and are not intended to limit the scope of the invention.

DETAILED DESCRIPTION OF THE INVENTION

A mircroarchitectural simulator, such as SimpleScalar or SMTSIM, includes a model of a microprocessor's pipeline and control logic, as well as an architectural simulator to simulate the flow of instructions through the microprocessor's pipeline. The simulator determines how many clocks are required to execute a given benchmark, and produces statistics about events such as pipeline stalls, cache misses, mispredicted branches, and the like. Such simulators are well-known and extensively discussed in the literature. See for example, D. Burger and T. M. Austin, "The SimpleScalar Toolset, Version 2.0", Computer Architecture News, Vole 25, No. 3 Jene 1997, pages 13–25, or D. M. Tullsen, "Simulation and Modeling of a Simultaneous Multithreading Processor", 22$^{nd}$ Annual Computer Measurement Group Conference, December 1996.

These and other simulators may be augmented to estimate power consumption, including the effects of clock-gating. For example, on each clock interval, the simulator may determine which units and pipestages are active. The simulator can compute the total power consumption during the clock by adding up the active power and idle power of units/pipestages ("blocks") that are on and off, respectively.

The active and idle powers for each block may be based on low-level circuit simulations, estimates provided by circuit designers, measurements based on actual circuits and the like.

In accordance with one embodiment of the present invention, the power supply voltage delivered to a processor is modeled from the output of a power simulator, using an electrical model of the power distribution network for the processor in combination with appropriate response functions for the distribution network.

Figure 1:
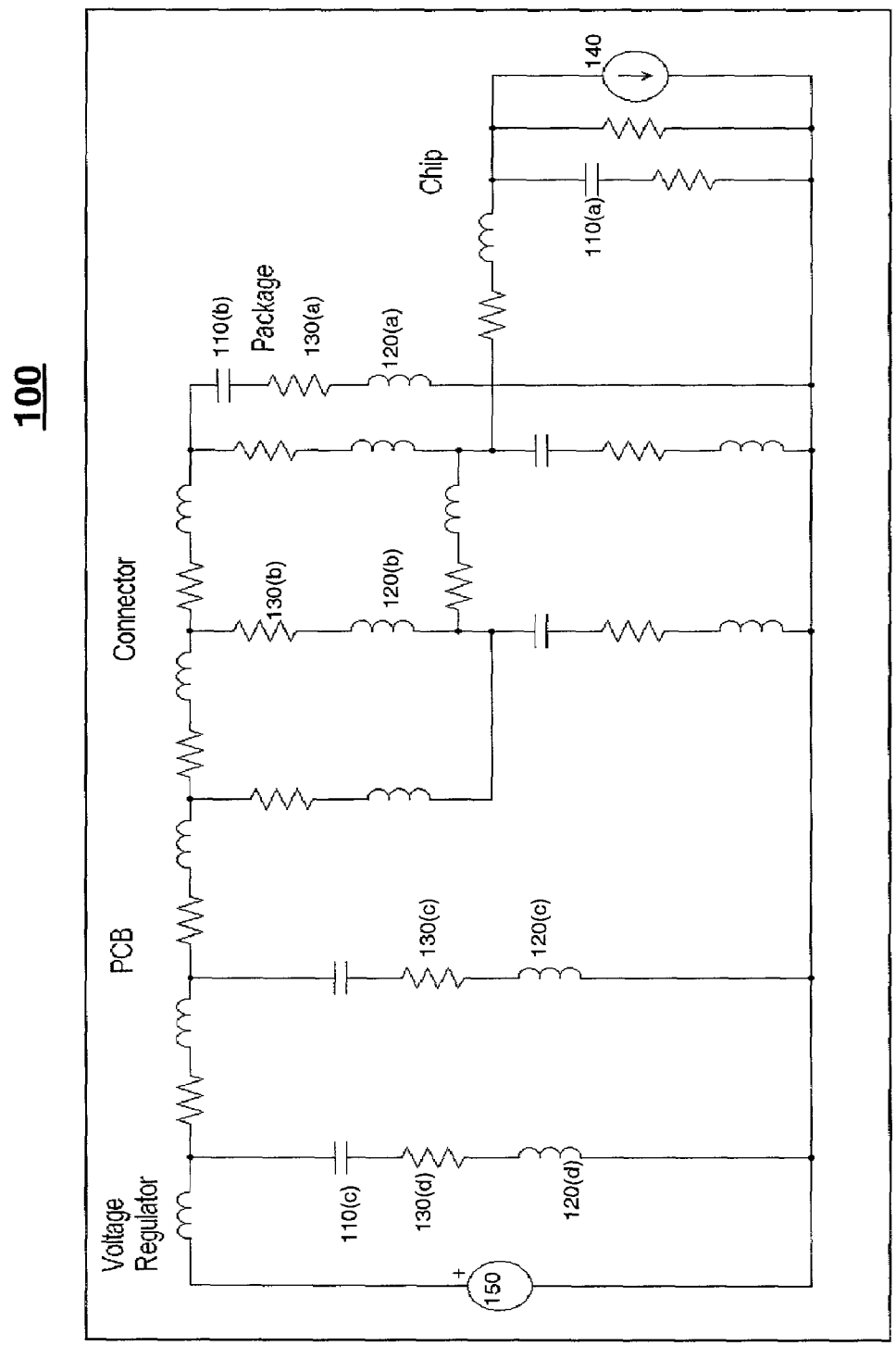
FIG. 1 is a circuit diagram of an electrical model that represents a power distribution network suitable for use with a processor.

FIG. 1 shows an electrical model of a power distribution network 100 for a high performance microprocessor. The model includes decoupling capacitors 110(a)–110(c) on the die, in the package, and in the voltage regulator, respectively. Also shown are parasitic inductances 120(a)–120(d) and resistances 130(a)–130(d) associated with the package, socket, printed circuit board, and devices within the voltage regulator. The microprocessor is modeled as a variable current sink 140, and the remainder of the voltage regulator is modeled as an ideal voltage source 150. Component values are chosen to be representative of those in the particular system being modeled. The construction of such models is discussed in D. J. Herrell, B. Beker, "Modeling of Power Distribution Systems for High-Performance Microprocessors", IEEE Transactions on Advanced Packaging, Vo. 22, Issue 3, August 1999, pp. 240–248.

Figure 2:
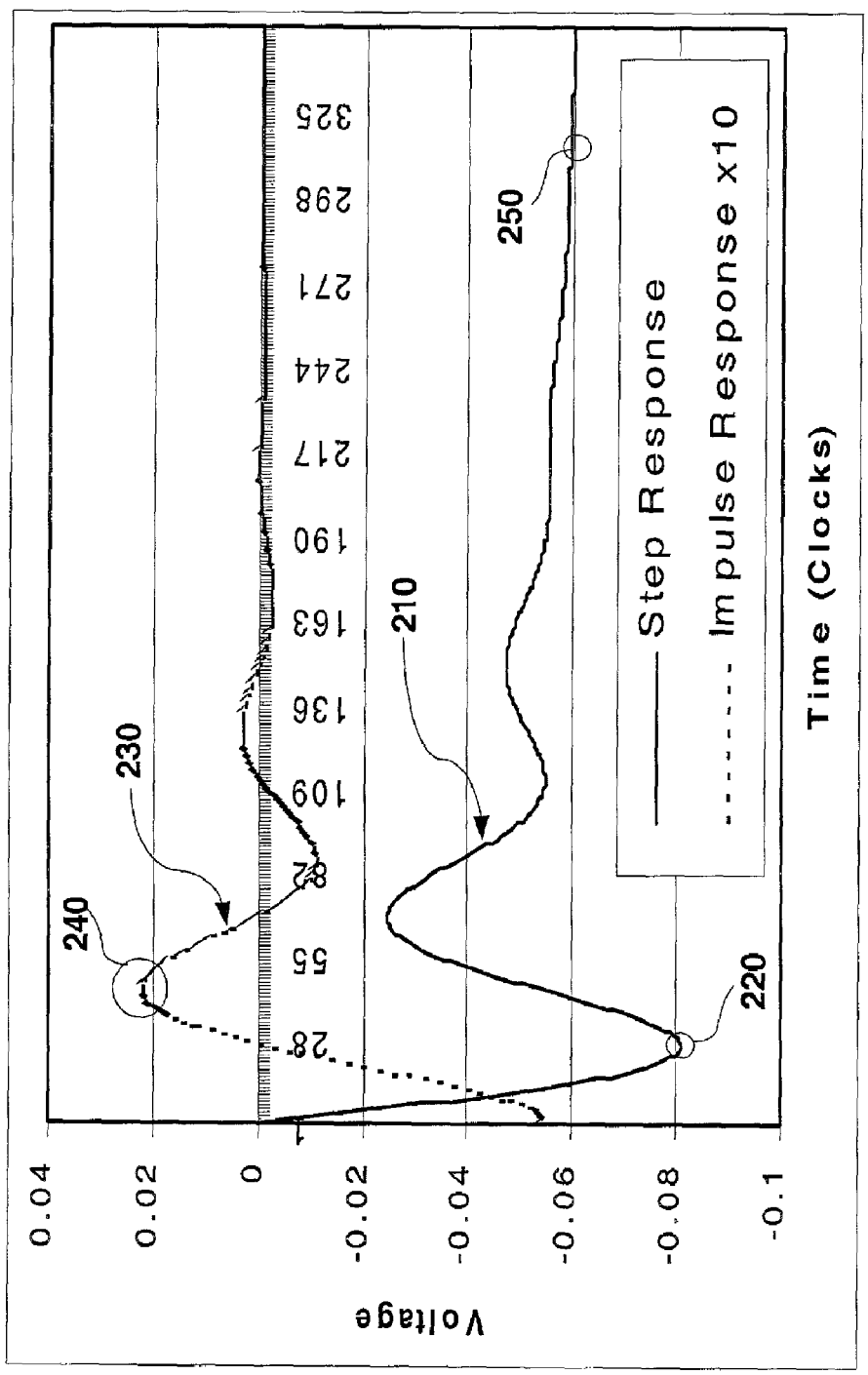
FIG. 2 represents a step response and an impulse response for the power distribution network of FIG. 1.

FIG. 2 represents the simulated response of power distribution network 100 to application of a 25 A current step (not shown). A sustained current increase of 25 A is applied to power distribution network 100, and the response (step response 210) of the supply voltage as seen by the microprocessor, is modeled. Step response 210 may be determined, for example, by running a Spice or comparable simulation on network 100.

The horizontal axis in FIG. 2 is divided into a sequence of time intervals. The intervals may correspond, for example, to the clock cycles of a processor driven by power distribution network 100. For the disclosed simulation, each interval corresponds to a 0.3 nanoseconds ("ns") clock cycle, to represent the response of a processor clocked at 3.3 GHz. Step response 210 dips and "rings" due to the inductance and capacitance of power distribution network 100. It reaches a local minimum 220 approximately 30 clocks after initiation of the current step. Two exponentially decaying sinusoidal signals are discernable in step response 210 over the modeled interval. A high frequency contribution is responsible for local minimum 220. This contribution may be attributed to RLC resonances associated with on-chip components 110(a), etc. A lower frequency contribution is responsible for a second local minimum 250. This contribution may be attributed to RLC resonances associated with packaging and/or connector components, 110(b), 120(a), 130(a), etc. A still lower frequency contribution, associated with power supply components, may be apparent if the modeled interval is extended. An impulse response 230 is also shown in FIG. 2. Here, impulse response 230 represents the response of power distribution network 100 to a single 25 A pulse of 0.3 ns duration. Impulse response 230 is proportional to the first derivative of step response 210. It may be computed from step response 210 by taking the difference between adjacent samples of step response 210. Alternatively, it may be computed directly by modeling the response of network 100 to a 0.3 ns pulse having an amplitude of 25 A.

Step response 210 and impulse response 230 are examples of response functions that may be used to characterize the behavior of a power delivery network to an electrical stimulus.

One embodiment of the present invention provides a mechanism for determining the voltage seen by a processor as a function of its variable activity over time. The activity may be represented as a current waveform or as discrete current pulses. These may be provided by a simulator, such as SimpleScalar or SMTSIM, that has been enhanced to model the effects of power consumption. As discussed in greater detail below, the activity may also be provided by an operating processor. In the latter case, a mechanism is provided for mitigating the effects of di/dt-induced voltage changes.

The disclosed mechanism relies in part on the observation that power distribution network 100 is, to rough approximation, a linear network. Linear systems are characterized by two properties: (1) scaling an input to the system (current step or pulse amplitude) by a certain amount causes the output to scale in proportion; and (2) applying a linear combination of two inputs to the system produces the same output as does taking the linear combination of the outputs produced by the system in response to each input, individually (superposition). The scaling property may be represented mathematically as $f(c*x)=c*f(x)$ where c is a constant. For example, doubling the amplitude of the input current step in FIG. 2 to 50 A leads to an approximate doubling of the depth of local minimum 220. Superposition may be represented mathematically as $f(x+y)=f(x)+f(y)$. In the example of FIG. 2, this means that response of distribution network 100 to first and second current impulses is reasonably approximated by summing the response of distribution network 100 to the first current impulse and its response to the second current impulse, following an interval representing the delay between application of the first and second current impulses.

Figure 3:
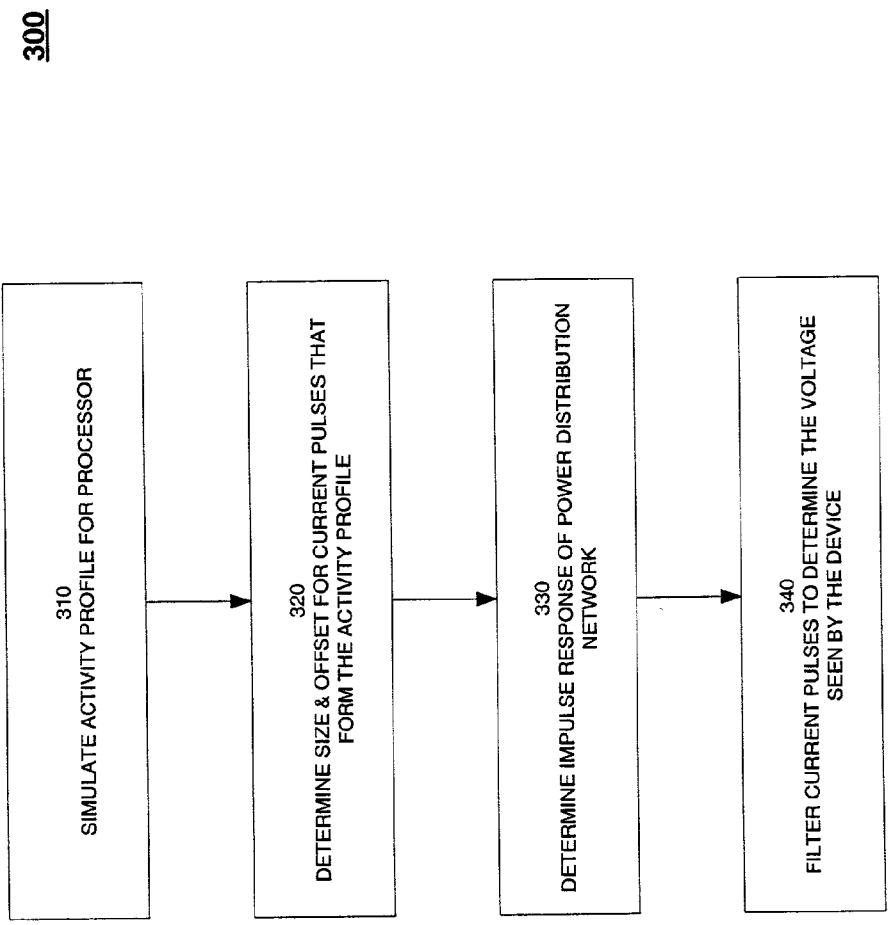
FIG. 3 is a flow chart representing one embodiment of a method in accordance with the present invention for simulating voltage variations in an integrated circuit.

FIG. 3 is a flow chart representing one embodiment of a method 300 in accordance with the present invention for estimating the voltage response of a power distribution network to an activity profile of an integrated circuit. In accordance with the present invention, an activity profile for the system is determined 310. The activity profile may be a current waveform, a sequence of current pulses, or a comparable output of a simulator, as described above. If a processor is being simulated, the activity profile may be taken as the output of a simulator in response to a particular code sequence over a given time period. For example, a series of current pulses (one pulse per clock) representing the current drawn by the active and inactive units of a processor on a series of clock cycles ("intervals") may be calculated in the manner described above. For an actual processor, the activity profile may be provided by monitoring its current consumption on, e.g., a clock by clock basis. A current waveform representing the activity profile of the processor may be resolved into a series of current pulses. In either case, the activity profile at selected intervals is characterized 320 by a size (amplitude of the current pulse) and offset (time of the interval relative to a reference time). For a microprocessor, the selected interval may correspond to one or more clock intervals. In the following discussion, the activity profile at a selected interval is referred to as a pulse.

The impulse response of a target power distribution network including the device, e.g. a microprocessor, is determined 330. For one embodiment of method 300, application of current step having a specified size and duration to the target network may be simulated, and an impulse response determined from the simulated voltage response. Alternatively, the response of the power delivery network to a current impulse having a duration corresponding to the selected clock interval(s) may be simulated directly. If an actual system is available, it may be possible to measure the impulse response directly.

The current pulses of the activity profile are then converted 340 to a voltage response of the power network, using the impulse response of the network and a filter technique. Suitable filter techniques include, for example, finite impulse response (FIR) filters, e.g. convolution, and infinite impulse response (IIR) filters.

For one embodiment, an FIR filter scales and shifts each current pulse, according to its amplitude and offset, to provide a corresponding scaled, shifted impulse response. The scaled/shifted impulse responses for each pulse that generates a response in a given interval are then summed to provide a voltage response of the power network in the interval. The scaled/shifted responses of the network to the sequence of pulses over the time period represent a convolution of the activity pulses with the response function of the network.

For another embodiment, coefficients are determined for an IIR filter that reproduces the impulse response. The coefficients are applied to the current pulses and, recursively, to earlier voltages determined from the current pulses, to indicate a voltage profile seen by the device.

Figure 4:
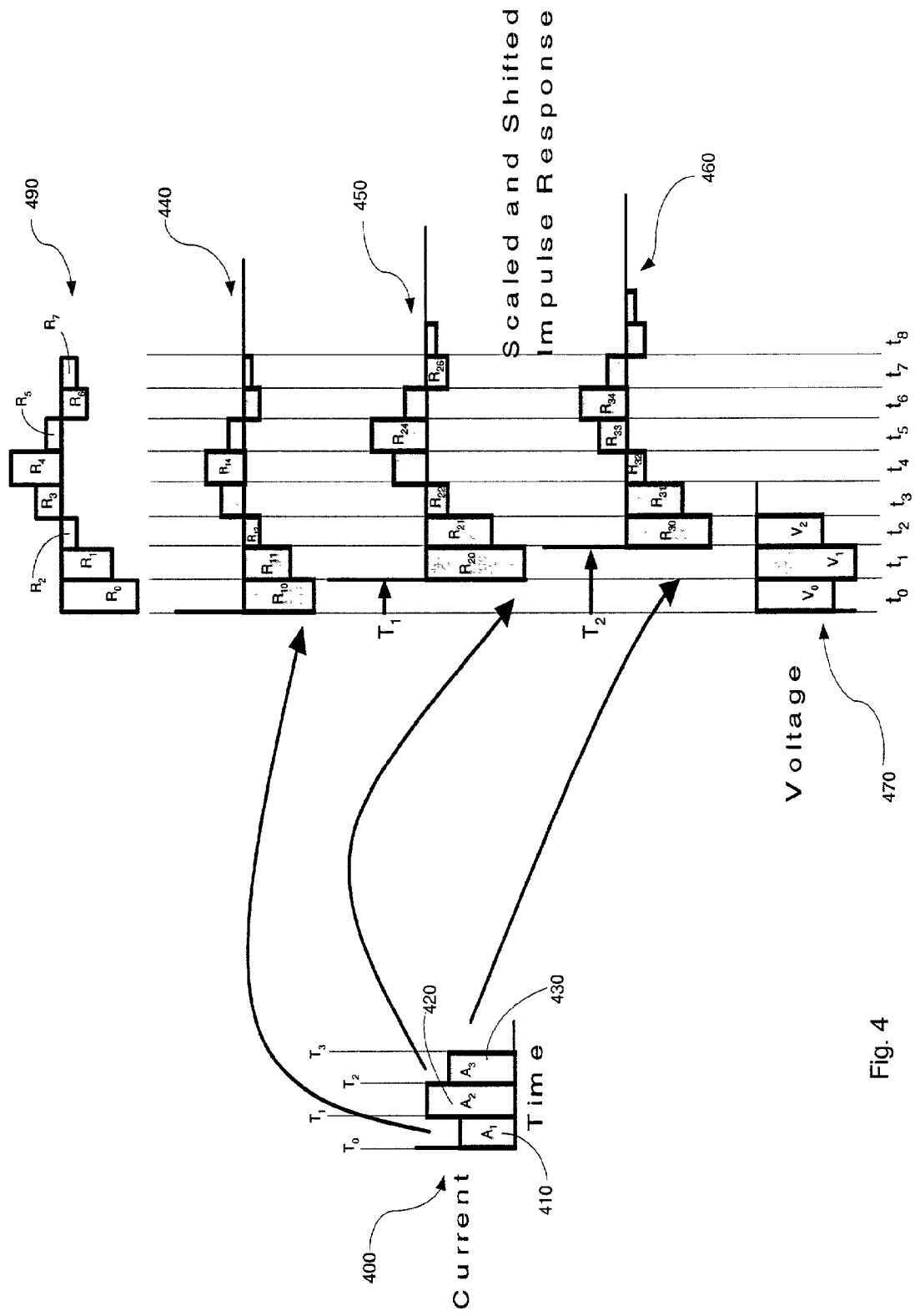
FIG. 4 is a schematic representation of the method shown in FIG. 3

FIG. 4 is a schematic representation of an FIR method described in conjunction with FIG. 3. In the illustrated example, an activity profile 400 comprises current pulses 410, 420, 430 having amplitudes $A_1$, $A_2$, $A_3$, respectively. Current pulses 410, 420, 430 may represent, for example, the current drawn by a processor executing a code sequence on successive clock cycles. Current pulses 410, 420, 430 are initiated at offset times $T_0$, $T_1$, $T_2$, ...

For purposes of illustration, a base impulse response 490 for a specified current amplitude, e.g. 25 A, is represented as a sequence of impulse response amplitudes $R_0$–$R_7$ over 8 intervals ($t_0$–$t_7$). Impulse responses 440, 450 and 460 represent base impulse response 490 (impulse response amplitudes $R_0$–$R_8$) 490 following scaling by amplitudes ($A_1$, $A_2$, $A_3$, ...) and shifting by offsets ($T_0$, $T_1$, $T_2$, ...) of pulses 410, 420 and 430, respectively. Here, $R_{ij}$ represents amplitude $R_j$ of impulse response 490, scaled by current pulse amplitude $A_i$. Assuming the power delivery network characterized by base impulse response 490 is linear, $R_{10}=c \cdot A_1 \cdot R_0$, $R_{32}=c \cdot A_3 \cdot R_2$, and in general $R_{ij}=c \cdot A_i \cdot R_j$ (Scaling). Shifting impulse responses 440, 450, 460 reflects the different times at which their source current pulses 410, 420, 430, respectively, are initiated. In the disclosed example, $T_0$ is taken as the reference time. Voltage waveform 470 represents the sum of impulse responses 440, 450 and 460 in corresponding intervals, $t_0$, $t_1$, $t_2$, ... (Superposition).

For example, voltage pulse $V_0$ represents an amplitude of impulse response 440 at time interval to ($R_{10}$). Voltage response $V_1$ represents the sum of impulse response amplitudes $R_{11}$ and $R_{20}$ in time interval $t_1$, and voltage response $V_2$ represents the sum of impulse response amplitudes $R_{12}$, $R_{21}$, and $R_{30}$ in time interval $t_2$. Shifts indicated by offsets $T_1$ and $T_2$ align impulse response amplitudes $R_{20}$–$R_{28}$, and $R_{30}$–$R_{38}$, of impulse responses 440 and 450, respectively, relative to amplitudes $R_{10}$–$R_{18}$ of impulse response 460.

In general, the voltage at an interval, $t_n$, is the sum of the impulse response amplitudes for all current pulses that have non-zero amplitude at $t_n$. As indicated in FIG. 4, if the current pulse is initiated at a time, $T_k$, the contribution of the current pulse to the voltage at interval $t_n$ is proportional to $c \cdot A_k \cdot R_{n-k}$. Here, $R_{n-k}$ is the amplitude of impulse response 490 in the interval n–k, where the difference reflects the start time of the current pulse relative to reference time, $T_0$.

Figure 5:
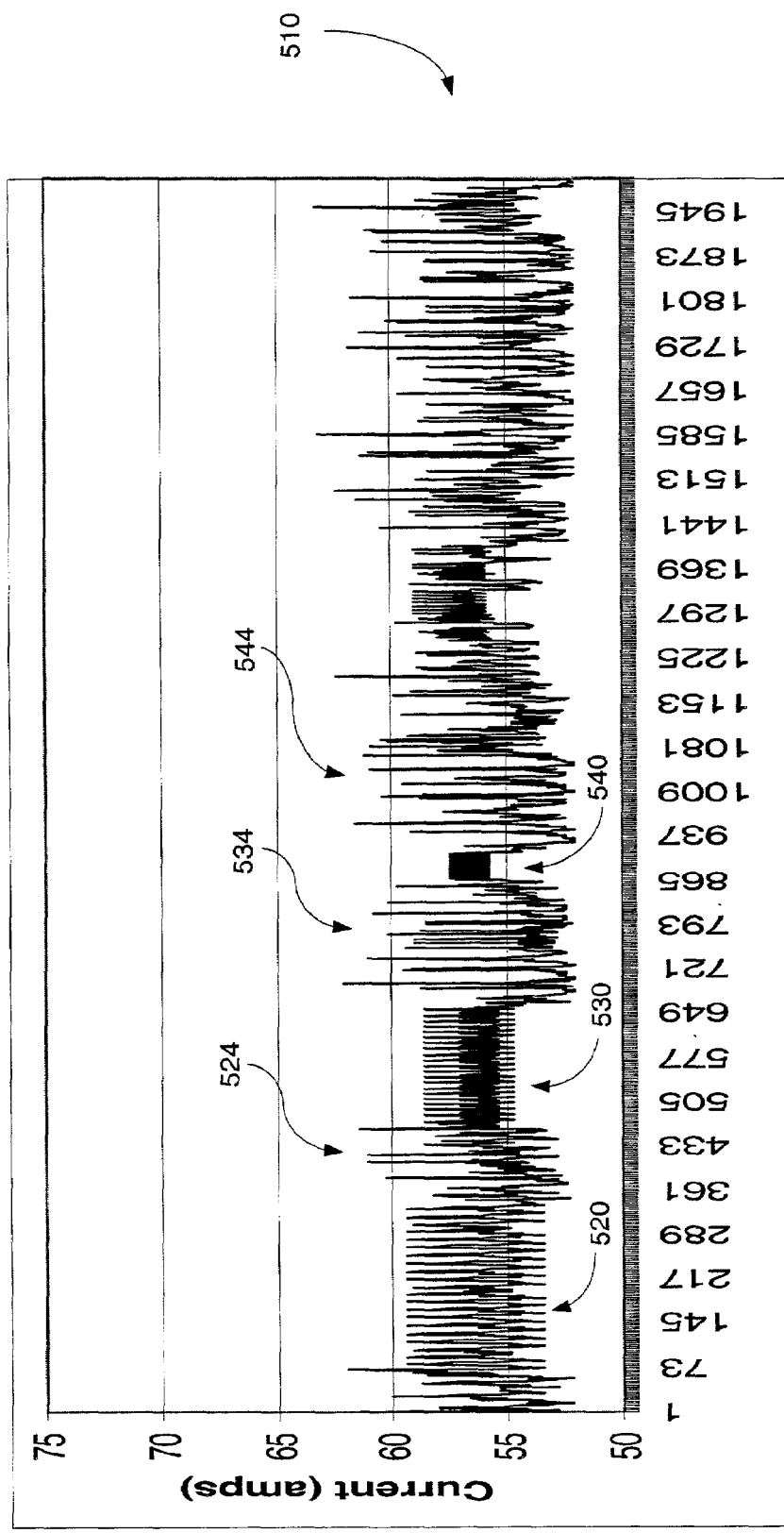
FIG. 5 represents the output of a power simulator for a processor executing a block of code over approximately 2000 clock cycles.
Figure 6:
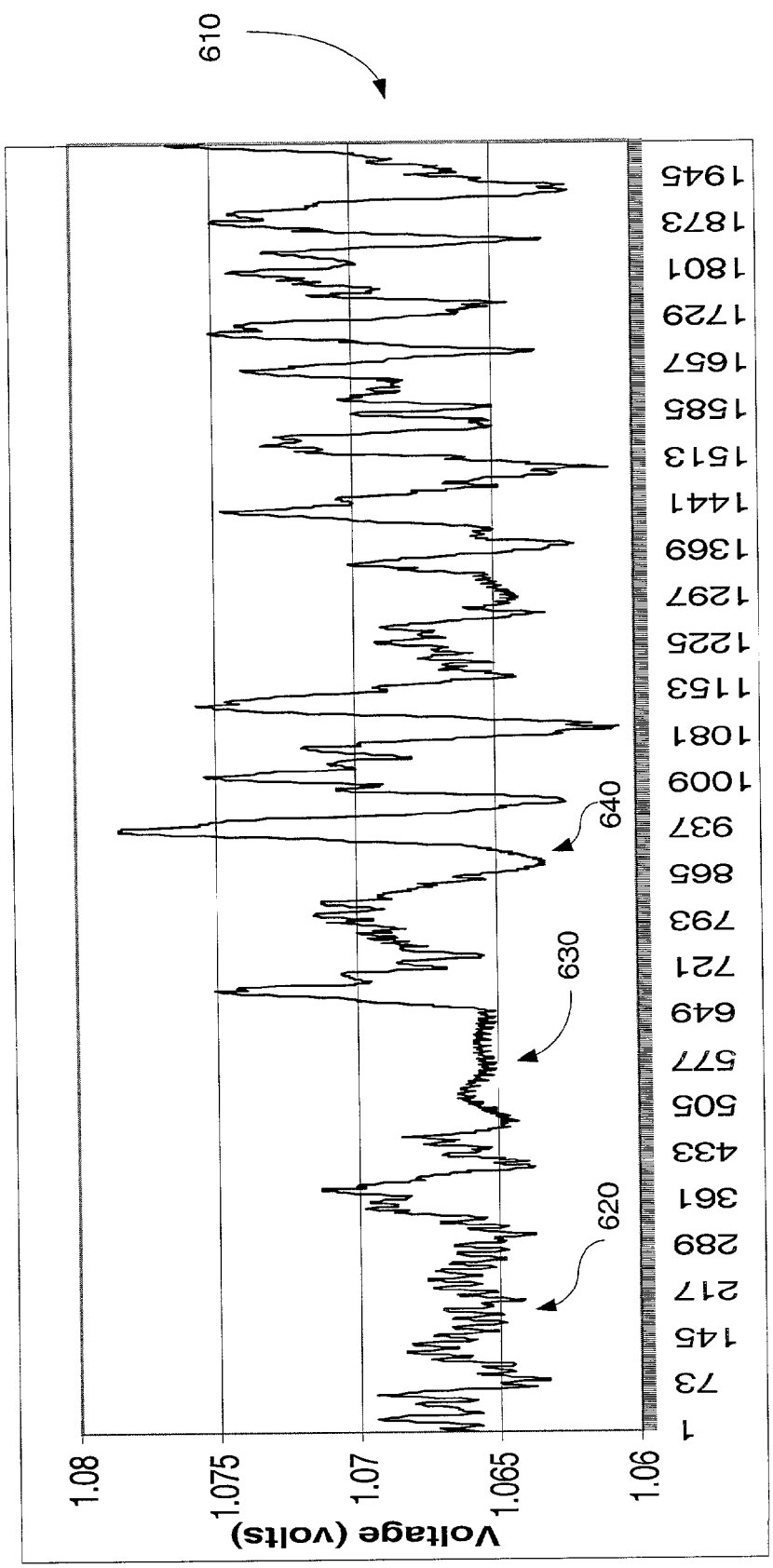
FIG. 6 represents the supply voltage of the processor simulated in FIG. 5 over the same interval, as determined using a simulator in accordance with the present invention.

A current simulation for a microprocessor and a voltage response derived from the current simulation in accordance with the present invention are shown in FIGS. 5 and 6, respectively. FIG. 5 represents a simulation of the power consumed by an Itanium™ processor of Intel® Corporation of Santa Clara, Calif. The processor is simulated running a portion of an Apache web server and gzip file compression program for 2000 clock cycles. Current curve 510 exhibits different phases of program execution, each phase being characterized by efficiency, e.g. instructions per cycle (IPC), and current levels. In general, those clock cycles in which larger numbers of instructions execute in parallel (high IPC) are indicated by correspondingly higher current consumption, since more units of the processor are turned on. Conversely, clock cycles in which fewer instructions execute in parallel (lower IPC) have fewer units activated, and current consumption is correspondingly lower. Over the simulated interval, the processor's supply current varies from 52 A to 72 A.

Phases 520, 530, 540 in which current levels oscillate rapidly and reproducibly between higher and lower power levels are associated with code loops. Code loops execute the same instructions repeatedly with greater and lesser levels of IPC. These phases are interleaved with phases 524, 534, 544, in which little loop activity is visible, and current levels vary more randomly. The peak-to-peak current variations in phases 534, 534, 544 are noticeably larger than those associated with loop phases 520, 540, 550. Beginning around clock cycle 1200, there is an extended interval in which the code section contains only a few short loop segments. In this region, current consumption varies widely and unpredictably.

FIG. 6 represents a simulation in accordance with the present invention of supply voltage variations 610 corresponding to the processor current consumption reflected in FIG. 5. Voltage curve 610 reflects approximately the events indicated in curve 510 of FIG. 5. For example, phases 620, 630, 640 correspond to loop phases 520, 530, 540, respectively, in which the peak-to-peak current varies regularly. For the modeled code sequence and processor, loop phases are characterized by relatively high IPC and high current consumption. The supply voltage level drops in phases 620, 630, 640, reflecting increased current consumption by the processor. The voltage variations below clock cycle 900 are relatively mild. However, above clock cycle 1152, where power consumption is more erratic, the voltage swings are significantly larger. While these voltage variation still falls within the allowable range for processors, the Apache/gzip workload does not represent a worse-case di/dt pattern.

The voltage variations evident in curve 610 can have serious consequences for processor operations. For example, the logic circuits that make up the processor require power supply voltages within a certain range to operate dependably. Voltage excursions outside this range may lead to computational errors or catastrophic circuit failures in the processor. Simulations such as those indicated in FIG. 6 allow processor designers to study the impact on processor voltage of various power/performance tradeoffs. As discussed below in greater detail, real-time determinations of voltage profiles on actual systems may be used to limit the extent of voltage excursions.

A microprocessor's power delivery system is typically designed for the worst-case software that it is likely to run. The worst-case software is usually a program with extremely high IPC (for maximum power consumption), or a program that rapidly alternates between extremely high IPC and extremely low IPC (for maximum di/dt). Such programs are referred to as power viruses because they stress the power delivery system much more than normal application software. Clock-gating allows a processor that is designed for typical power consumption rather than worst-case power consumption, to throttle its performance if it reaches a specified power threshold. However, clock-gating also magnifies the di/dt effects on voltage.

The above-described method facilitates the development of on-die power computation and regulation hardware ("current control units") for processors and other instruction-executing devices. In addition to providing insights into how a processor's voltage may be impacted by certain code sequences, these simulations allow various di/dt-mitigating-strategies to be tested at a pre-silicon stage. The benefit of insights that flow from the above-described simulations may be appreciated by reference to a processor design that implements di/dt control. One such embodiment is described below in greater detail.

Figure 7:
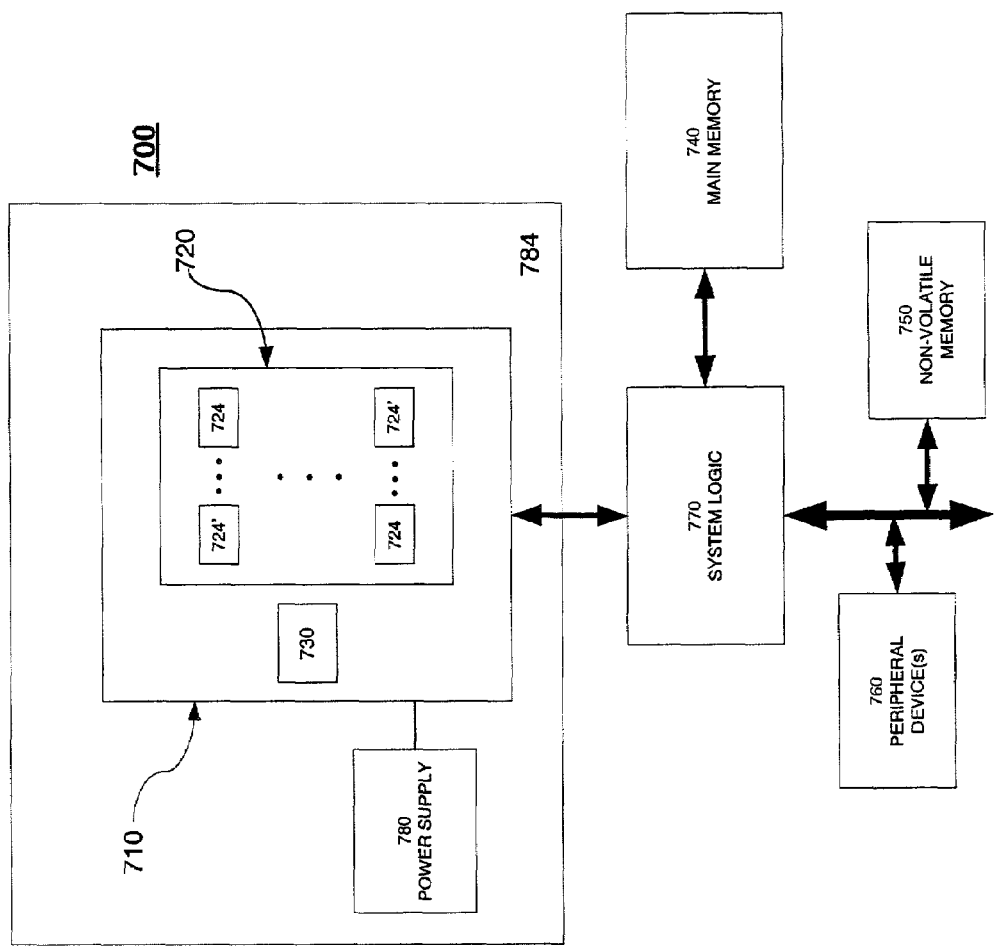
FIG. 7 is a block diagram representing one embodiment of a computer system employing a di/dt control mechanism.

FIG. 7 is a block diagram of one embodiment of a computer system 700 in which di/dt control is implemented. By way of example, computer system 700 includes a processor 710, a main memory 740, a non-volatile memory 750, various peripheral devices 760, system logic 770, and a power supply 780. System logic 770 controls data transfers among processor 710, main memory 740, non-volatile memory 750, and peripheral devices 760. Power supply 780 provides power at a reference voltage for logic devices in processor 710. Computer system 700 is provided to illustrate various features of the present invention. The particular configuration shown is not necessary to implement the present invention. For example, system 700 may include multiple processors 710 or other instruction-executing devices, and the various components shown may be combined or eliminated in whole or in part. Systems such as personal digital assistants (PDAs), smart phones, and the like may be expected to include devices and connections not shown in the disclosed embodiment.

Processor 710 includes multiple units 724, which form an instruction execution pipeline 720. Instructions may be provided to processor 710 from main memory 740, non-volatile memory 750 or other storage devices (not shown). The amount of current consumed by processor 710 is determined by the level of activity generated in various units 724 by instructions (or lack thereof) in pipeline 720. A current control unit (CCU) 730 monitors current use by selected units 724 in response to the processed instructions and adjusts the activity level of processor 710 accordingly. System 700 is shown including a single CCU 703. Other embodiments may employ multiple CCUs 730, each of which controls di/dt locally for one or more units 724.

As an instruction is staged down pipeline 720, it directs various units 724 to perform one or more operations that, taken together, implement the instruction. For example, a floating-point multiply-accumulate instruction (FMAC) may cause the following operations to occur in the indicated resources: a floating point register file reads out three operands; an FMAC execution unit multiplies two of the operands and adds the product to the third operation; an exception unit checks the product and sum for errors; and a retirement unit writes the result to the floating point register file if no errors are detected. Depending on the particular processor implementation, these resources or their components may be grouped into one or more units 724, which are turned on and off as the instruction is staged down the pipeline.

Each unit 724 draws a certain amount of current when it is activated by the instruction. For computer system 700, power supply 780 provides the current while maintaining the reference voltage level within a specified range. If activation or deactivation of one or more units 724 triggers a significant change in the current demanded by processor 710, CCU 730 responds to mitigate the change. One embodiment of CCU 730 takes advantage of the behavior illustrated in the above-described simulation to mitigate the effects of di/dt on the reference voltage used by processor 710.

The activated/deactivated states of selected units 724' may be monitored to provide an estimate of the current consumed by processor 710 on a given clock cycle. Selected units 724' may be those that draw large currents when active, because these are likely to create sudden changes in di/dt when they are switched between their active and inactive states. CCU 730 monitors the state of one or more selected units 724' on successive clock cycles to estimate a resulting current or voltage level over a selected time period. The estimated level is compared with one or more threshold values to determine whether the activity level of the processor should be adjusted. For example, if an estimated voltage level is less than a first threshold, the flow of instructions through pipeline 720 may be reduced. If the estimated voltage level is greater than a second threshold, a unit 724' that might otherwise be deactivated can be left activated to reduce the rise in the voltage level.

One embodiment of CCU 730 estimates the voltage level seen by the processor by tracking the active/inactive state (activity state=1/0, for example) of a selected unit 724' on n-successive clock cycles (sample period). The tracked states may be weighted, as discussed below, to represent an activity waveform or profile for processor 710. Current pulses that make up the profile may be analyzed using an impulse response suitable for the power delivery network of system 700 to provide a profile of the voltage seen by the processor. If the voltage falls outside a specified range, CCU 730 may alter the activity level of processor 710 to offset the anticipated change.

For one embodiment of CCU 730, values representing the amplitudes of each of n-current pulses may be stored in a series of storage locations. A shift register capable of storing multi-bit amplitude values in each entry may be employed for this purpose. As discussed below in greater detail, the number of entries is determined in part, by the accuracy with which the voltage seen by the processor is to be determined and the filter algorithm employed. The entry in which an amplitude value resides represents the offset of the corresponding current pulse from the start of a sampling window.

Periodically, e.g. on each clock cycle, the voltage seen by the processor is estimated from the current amplitudes ($A_i$) stored in the entries of the shift register. For one embodiment of CCU 730, the current amplitudes are staged through the shift register sequentially from entry 0 to entry n−1 ($E_0$ to $E_{n-1}$) on successive clock cycles. The shift register contents thus provide a snapshot of the device's activity level profile over an n-clock cycle window. At a given time, the most recent current pulse amplitude is in $E_0$, and it contributes to the voltage seen by the processor an amount that is proportional to the amplitude value it stores ([$E_0$]) and to the network impulse response in the first interval ($R_0$). Similarly, the next most recent pulse is in entry 1, and its contribution to the voltage is proportional to the amplitude value it stores ($[E_1]$) and the network impulse response in the second interval ($R_1$).

In general, the voltage response at a particular time may be estimated as:

$$V = c \sum_{i=0}^{n-1} [E_1] \cdot R_1$$

That is, a weighed sum of the current amplitudes for the last n-clock cycle is calculated on each clock cycle, with weights provided by the impulse response amplitude in corresponding intervals. The shift register shifts the current pulse amplitudes to provide the offset relative to the impulse response that was discussed in conjunction with FIG. 4. The shift register contents thus provide a sliding window through which a running profile of the voltage levels seen by the processor can be estimated. In effect, this embodiment of CCU 730 convolutes the measured activity profile of the processor with the impulse response of its power delivery network to anticipate changes in the voltage level seen by the processor. Convolution is an example of a finite impulse response (FIR) algorithm. As discussed below, current control circuits based on inifinite impulse response (IIR) algorithms may also be implemented.

For one embodiment of a system employing a CCU 730, a pipeline control circuit (FIG. 8A) adjusts pipeline activity to offset the anticipated change in voltage level if it falls outside an acceptable range. The impulse response may be modeled using a power supply network similar to that of FIG. 2 with components designed to reflect the capacitive, inductive, and resistive properties of computer system 700. Alternatively, the impulse response of an actual system may be measured.

Figure 8A:
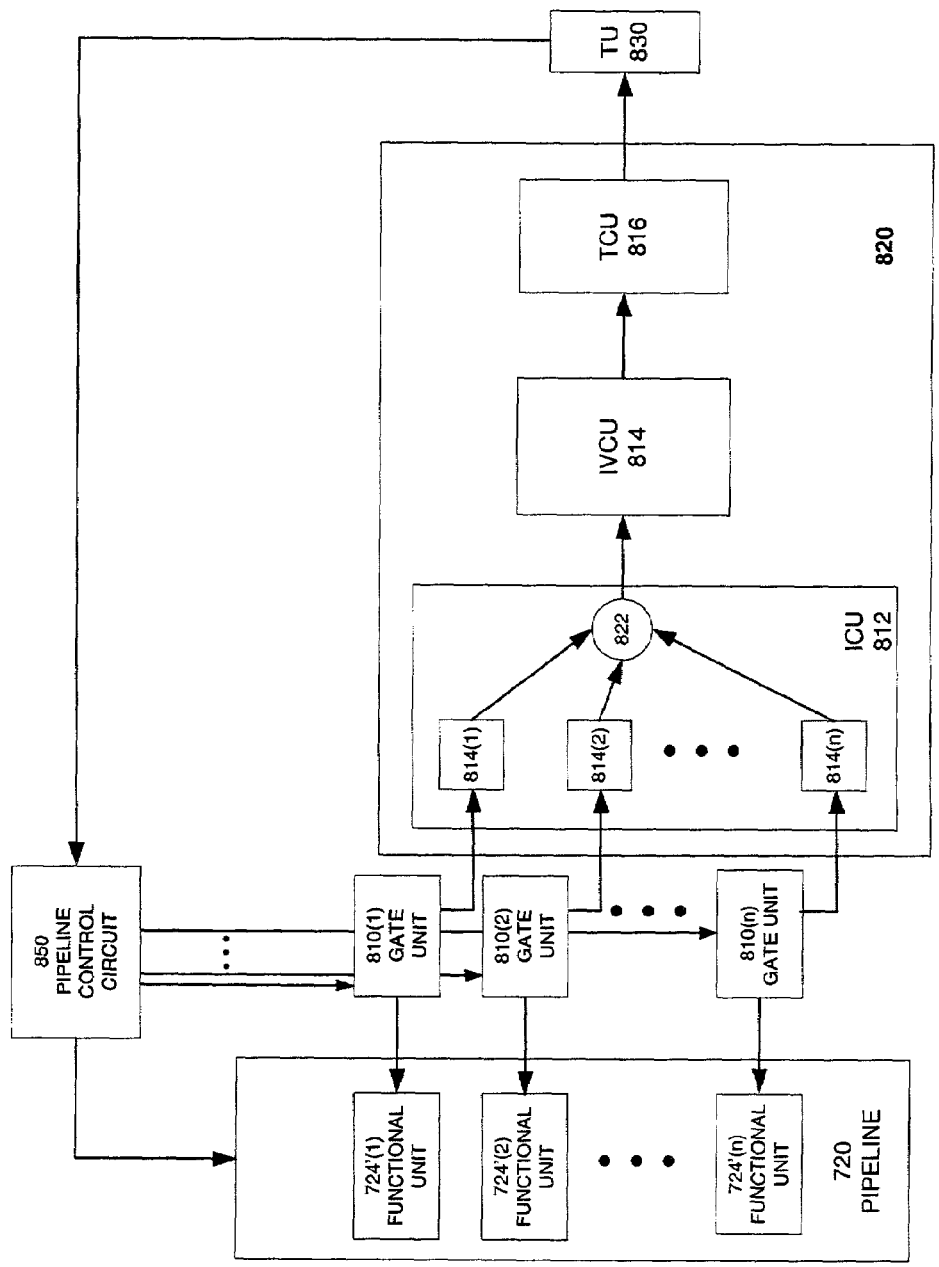
FIG. 8A is a block diagram of one embodiment of a di/dt controller in accordance with the present invention.

FIG. 8A is a block diagram representing one embodiment of CCU 730 and its interactions with selected units 724' of pipeline 720. The disclosed embodiment of CCU 730 includes gate units 810(1)–810(n) (generically, gate unit 810), a monitor circuit 820, and a throttle circuit 830. Each gate unit 810 controls power delivery to an associated unit 724' in pipeline 720. For example, gate unit 810 may be a clock gating circuit that couples or decouples a clock signal to unit 724' according to whether or not the services of unit 724' are used to implement an instruction currently in the pipe stage(s) in which unit 724' operates. Also shown in FIG. 8A is a pipeline control circuit 850 which indicates to gate units 810 which units 724' are active for the currently executing instructions.

For the disclosed embodiment of CCU 730, gate unit 810 provides a signal to monitor circuit 820 to indicate whether its associated unit 724' is active. The signal may be an activity state of unit 724', which is asserted when unit 724' is turned "on" and deasserted when unit 724' is turned "off". A typical processor may include 10–20 gate units 810 to control power delivery to 10–20 units 724'. All units may be monitored for current changes, or subsets of the units may be monitored. For example, only those units, e.g. 724', that consume large amounts of current may be monitored. As noted above, multiple CCUs 730 may be employed to monitor multiple units or groups of units.

Monitor circuit 820 collects signals from gate units 810 over a sampling window and estimates a voltage seen by processor 710 based on the collected signals. The disclosed embodiment of monitor circuit 820 includes a current computation unit (ICU) 812, a current to voltage computation unit (IVCU) 814 and a threshold comparator unit (TCU) 816. As discussed below in greater detail, ICU 812 provides an estimate of the current consumed on successive clock cycles. IVCU 814 applies a filter algorithm to the estimated currents to generate an estimate of the voltage seen by the device, e.g. processor 710. TCU 816 compares the estimated voltage with one or more thresholds, and throttle circuit 830 adjusts the activity level of processor 710, if indicated by the comparison.

For the disclosed embodiment of CCU 730, ICU 812 includes weight units 814(1)–814(n) (generically, weight units 814) and an adder 822826. When present, each weight unit 814 provides a first or second value to adder 822 according to whether the activity state indicated by a gating circuit 810 for its associated unit 724' is inactive or activate, respectively. The first value represents the current drawn by unit 724' if it is not activated, and the second value represents the current drawn by unit 724' if it is activated. Adder 822 sums the values provided by weight units 814 and outputs the sum as an estimate of the current pulse drawn on each successive clock cycle by monitored units 724' of processor 710. Adder 822 and possibly weight units 814 may be eliminated if CCU 730 controls a single unit 724'. Also, if currents drawn by monitored units 724' are roughly comparable, weight units 814 may be eliminated.

IVCU 814 applies a filter algorithm to the current pulses provided by ICU 812 to generate an estimate of the voltage seen by processor 710, and TCU 816 compares the estimated voltage with one or more threshold values. If the estimated voltage exceeds the threshold value(s), throttle circuit 830 adjusts the activity level of processor 710 to counteract the threshold crossing.

For one embodiment of monitor circuit 820, an estimated voltage value that falls below a lower voltage threshold indicates that processor 710 may be drawing more current than the power delivery network can supply while remaining within the allowed voltage range. Under these circumstances, throttle circuit 830 may deactivate some units that would otherwise be activated. For example, throttle circuit 830 may cause a fetch unit (not shown) in processor 710 to inject no-operations (NOPs) into pipeline 720. NOPs are essentially blank instructions that require activation of few if any units. Under these circumstances, performance decreases since productive instructions are delayed while NOPs (unproductive instructions) run through pipeline 720. Power consumption is also reduced since NOPs activate few, if any, units.

On the other hand, the estimated voltage may exceed an upper voltage threshold when processor 710 is under-utilized and few units are activated. For this case, throttle circuit 830 may activate, e.g. provide drive current to, units 724' that would not otherwise be engaged by instructions currently in pipeline 720. For example, it may continue to deliver a clock signal to unused units 724', causing their circuits to charge and discharge despite the absence of corresponding instructions. This increases the power dissipated by processor 710 over that which is necessitated by the currently executing instructions. However, it has no direct impact on processor performance.

Figure 8B:
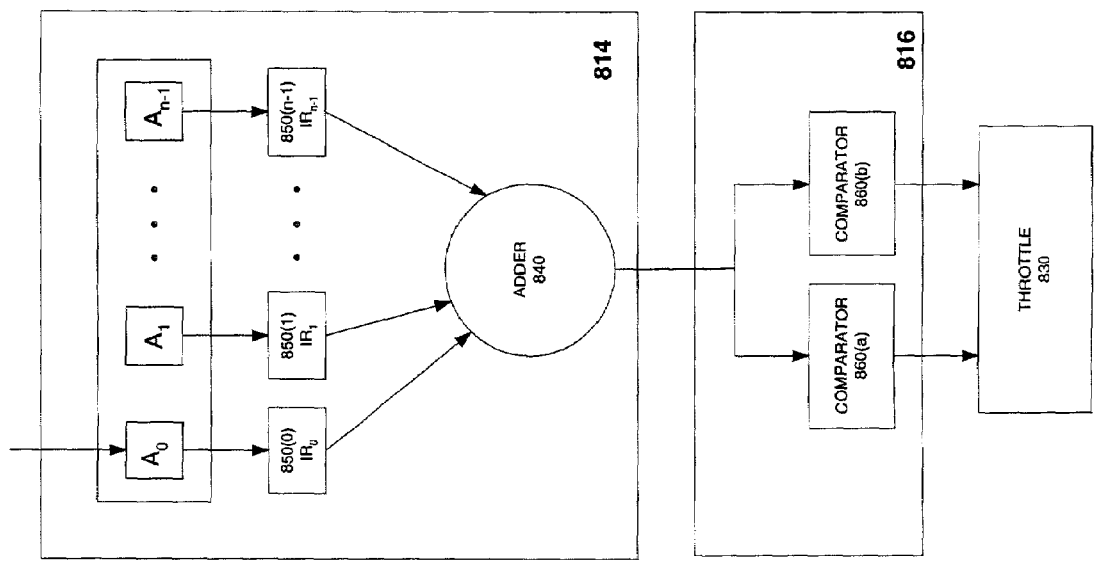
FIGS. 8B through 8E are block diagrams of various embodiments of the current to voltage computation unit of FIG. 8A.

FIG. 8B is a block diagram of an embodiment of IVCU 814 suitable for implementing the weighted sum voltage estimation algorithm (FIR) described above. An embodiment of TCU 816 is also shown. The disclosed embodiment of IVCU 814 includes an n-entry shift register 824 and an adder 826 receives its input signals through n-weight units 850(0)–850(n−1) (generically, weight units 850). Shift register 824 stores current amplitudes ($A_0$–$A_{n-1}$) for n-successive clock cycles in its entries. Weight units 850(0)–850(n–1) scale their respective inputs ($A_0$–$A_{n-1}$) from shift register 824 in proportion to the amplitudes of corresponding intervals of an impulse response for the power delivery system of interest. The disclosed embodiment of adder 826 implements the weighted sum of Eq. 1. That is, adder 826 effectively convolutes the n-activity states with the impulse response of the power delivery network including power supply 780 and processor 710.

The output of adder 826 represents the estimated voltage response $V_E$ of power supply network 784 to the current activity level of processor 710. In FIG. 8B, $V_E$ is provided to comparators 860(a) and 860(b) of threshold comparator 816 for comparison to upper and lower voltage thresholds, respectively. Comparator 860(b) determines if $V_E$ drops below the lower voltage threshold, and signals throttle circuit 830 to reduce current consumption if it does. Current consumption may be reduced by shutting off the clock directly, reducing instruction fetch or issue rates, or triggering some other current-conserving strategy.

Comparator 860(a) determines if $V_E$ exceeds the upper voltage threshold, and signals throttle circuit to increase current consumption (or at least maintain it at its current level). For example, throttle circuit may increase current consumption by forcing on units that would otherwise be clock gated off, or it may maintain power by preventing clock gating from cutting off additional units.

Between the upper and lower thresholds, the device, e.g. processor 710, is allowed to run normally. The voltage computation, threshold comparison, and current adjustment (if necessary) may be performed every clock or every m-clocks, depending on the control granularity required, the computational resources available and other factors. Real-time control of power supply voltage is enabled, assuming the computational resources required to estimate $V_E$ at a suitable rate can be accommodated on the processor die.

Figure 8C:
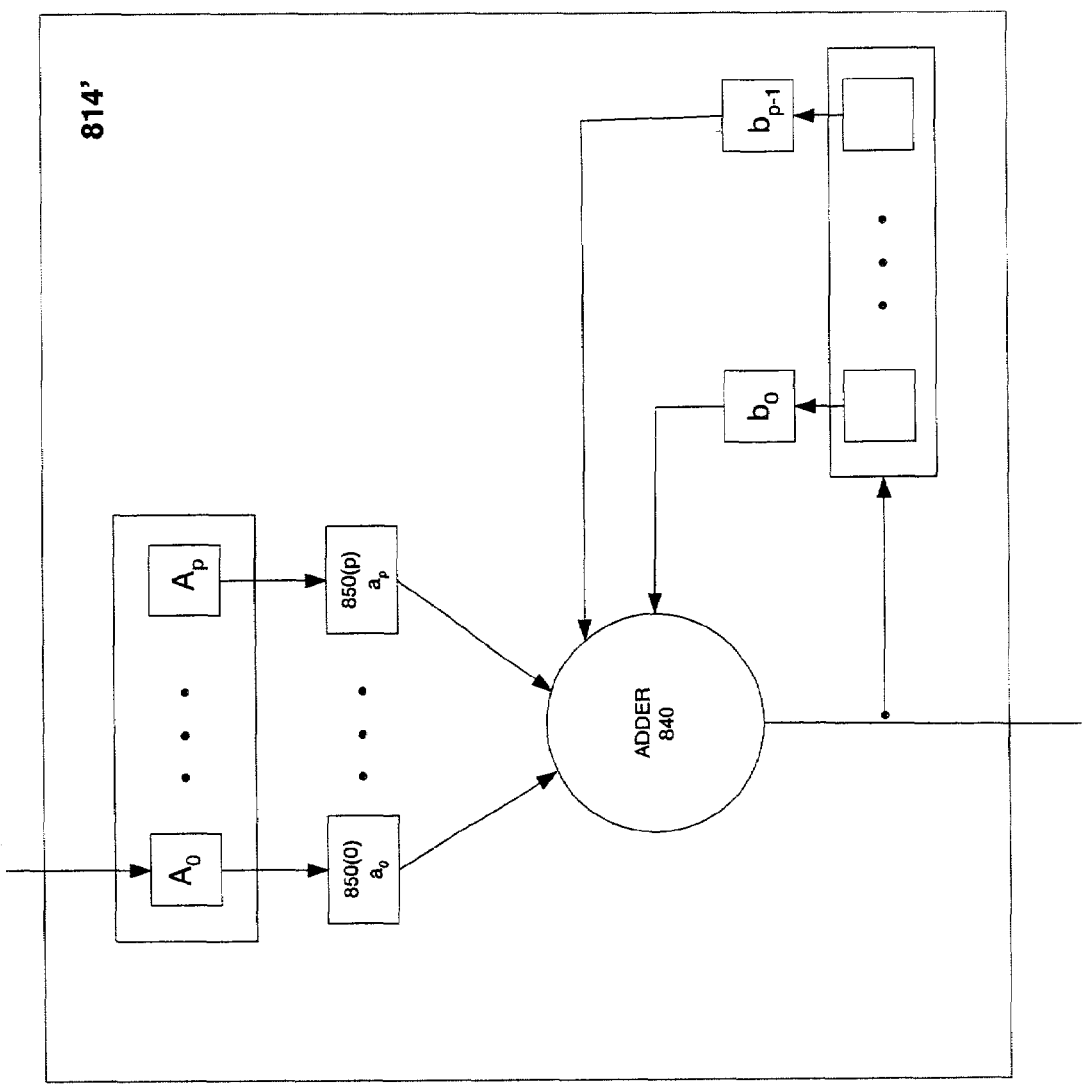

FIG. 8C is a block diagram of an embodiment of IVCU 814 that is suitable for implementing an IIR or recursive filter. IIR filters employ previously calculated filter outputs (e.g, earlier voltage estimates from adder 826), in addition to the input signal (e.g. currents from ICU 816) to determine a new filter output (e.g current voltage estimates). IIR filters are discussed in greater detail, for example, in Steven W. Smith, "The Scientists and Engineers Guide to Digital Signal Processing", California Technical Publishing ISBN 0-966176-3-3 (1997). In general, an IIR or recursive filter determines an output from a linear combination of input signals and previously calculated outputs, the latter providing the recursive element. An IIR filter function may be represented as:

$$V_p = \sum_{i=0}^{p} A_i \cdot a_i + \sum_{i=0}^{m} V_i \cdot b_i$$

Here, $a_0$–$a_p$ represent the coefficients that apply to p current amplitudes ($A_1$) and $b_0$–$b_m$ represent the coefficients that apply to the m prior voltage estimates ($V_i$). In general, if the last p current values are tracked, p–1 estimated voltages are available for tracking, and m=p–1. The coefficients $\{a_i\}$ and $\{b_i\}$ may be determined by curve fitting to the impulse response or step response (FIG. 2) of the power delivery network.

The disclosed embodiment of IVCU 814' includes a second shift register 828 and weight units 854(1)–854(p–1) in addition to p-entry shift register 824, adder 826 and weight units 850(1)–850(p). Shift register 824 stores a sequence of p current amplitudes and shift register 828 stores a sequence of the preceding p–1 estimated voltages. The latter are feedback to adder 826 to provide the recursive input for IVCU 814.

Figure 8E:
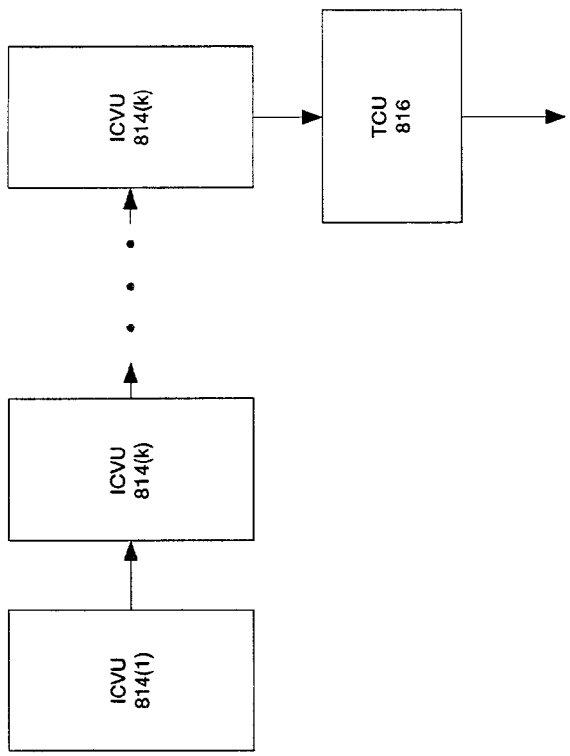
Figure 8D:
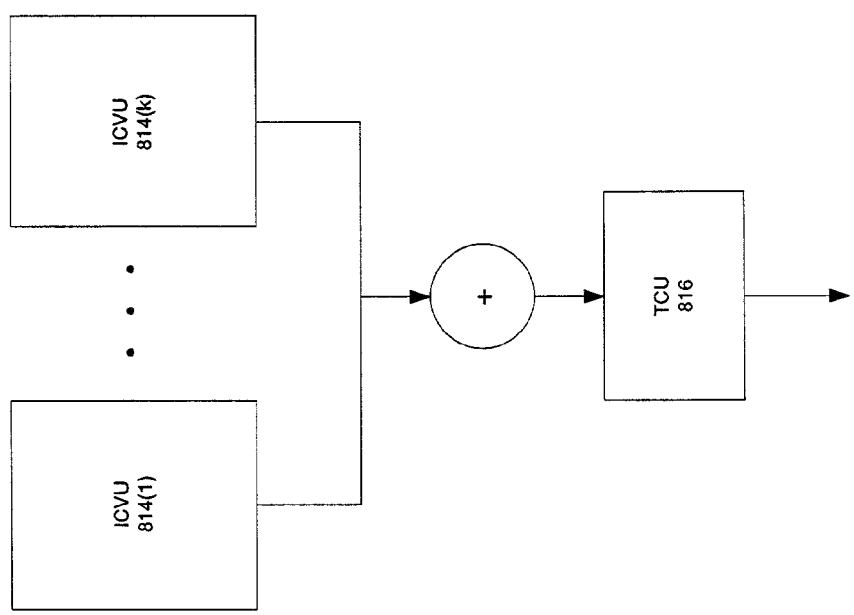

IVCU 814' is suitable for filtering current signals to provide an estimate of the voltage seen by processor 710 for the case in which step function 210 or impulse response 230 is dominated by one decaying sinusoidal contribution. Multiple IVCUs 814 may be employed to generate voltage estimates for cases in which there are multiple decaying sinusoidal contributions to the response of the power delivery network. Each sinusoidal contribution may be characterized by its own set of coefficients $\{a_i\}$ and $\{b_i\}$. FIG. 8D shows an IVCU 814" in which the results of k filters are combined in parallel to provide an estimate of the voltage seen by processor 710. FIG. 8E shows an IVCU 814''' in which the results of k filters are combined in series to provide an estimate of the voltage seen by processor 710. Either configuration may be use to combine IIR filter results for multiple resonance sources.

As indicated in FIG. 8A, CCU 730 includes a feedback loop, since the action of forcing units 724' on or off affects the computed supply current and voltage. These in turn affect the subsequent behavior of CCU 730. For IIR filters (FIGS. 8C–8E), the recursive component provides an additional feedback loop within IVCU 824.

Figure 9:
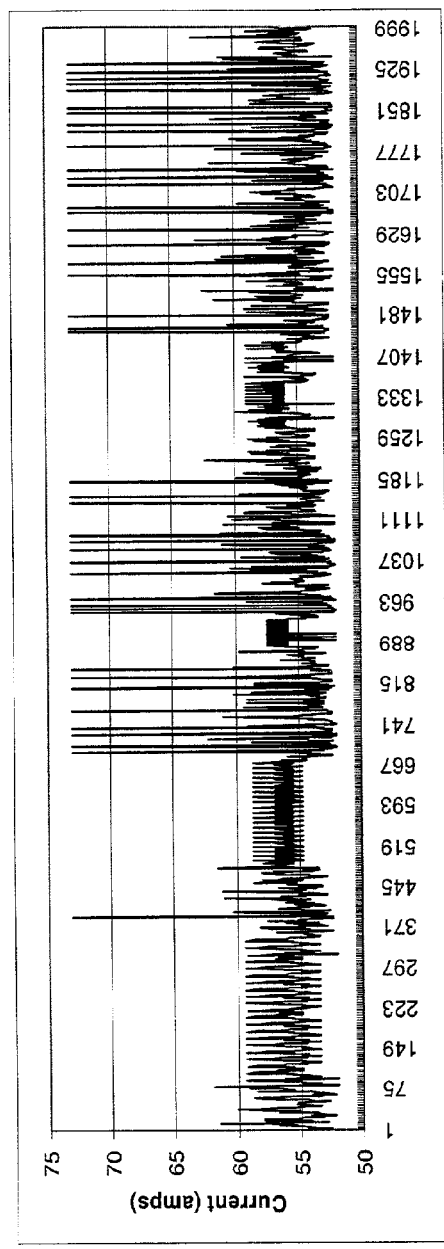
FIG. 9 represents a simulation of the output power of the processor of FIG. 7, operating under control of the current control unit of FIG. 8A.
Figure 10:
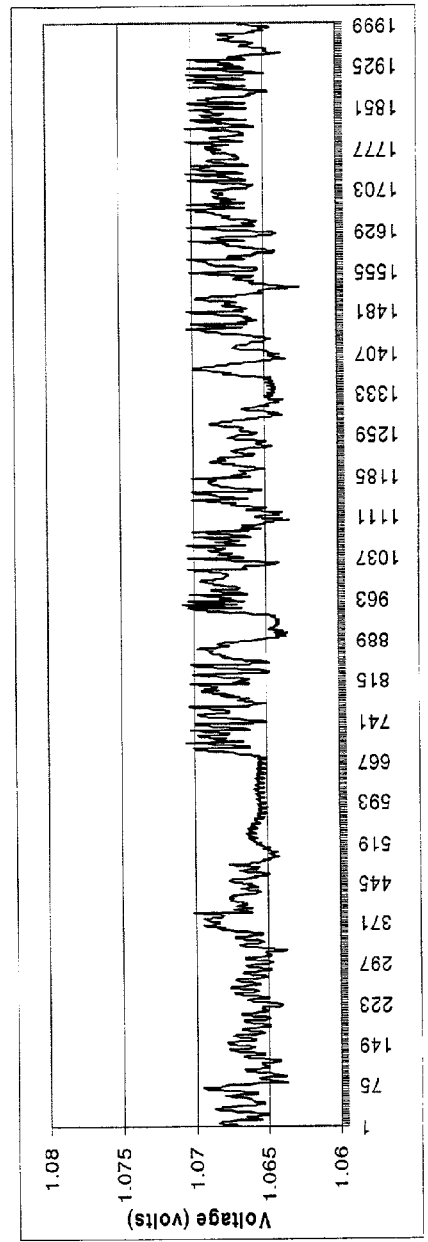
FIG. 10 represents the variation in the supply voltage of the processor simulated in FIG. 8A over the same interval.

Simulations of the effects of CCU 730 on current and power supply voltage are shown in FIGS. 9 and 10, respectively. Compared to FIGS. 5 and 6, the di/dt control provided by CCU 730 introduces sharp one clock spikes to both the maximum and minimum current levels. The spikes are a result of CCU 730 forcing the clock on or off in response to the computed voltage falling outside predetermined limits. Despite the spikes, the peak-to-peak variation in power supply voltage is less than the uncontrolled case because CCU 730, by its design, regulates the current to avoid exciting RLC resonances in the power distribution network.

The results of FIGS. 9 and 10 were simulated using an FIR algorithm applied to the full range of impulse response 230 (FIG. 2), which extends over more than 300 clock cycles. For CCU 730, this would amount to employing a shift register 824, weights 850 and adder 826 sized accordingly (n>300). Even with the circuit densities available in today's high performance processors, it is not practical to implement a monitor circuit 820 capable of convoluting an impulse response with current pulses for over 300 clock intervals in one clock cycle or even in several clock cycles.

Simulation results indicate that a 300 clock cycle interval of FIG. 2 is not necessary to provide results that are useful. For example, in FIG. 2 the largest variation of impulse response 230, e.g. local maximum 240, occurs approximately 25 clock cycles following initiation of the current pulse. This suggests that CCU 730 may convolute the current pulse and impulse response over a shorter interval and still provide a reasonable approximation to the voltage response of the power delivery network. As discussed below in greater detail, monitor circuit 826 may be realized with n as small as 25 or 30.

One embodiment of the present invention allows the tradeoff between performance and voltage stability to be simulated for different convolution intervals. Different performance levels may be tested by altering the voltage threshold at which CCU 730 triggers di/dt-mitigating operations. For example, if the lower voltage threshold at which CCU 730 initiates activity-reducing operations, e.g. injection of NOPs, is reduced, processor 710 continues operating at full performance over a wider voltage range but at a cost of exposing its circuitry to greater voltage variations. Raising the lower voltage threshold at which CCU 730 initiates activity-reducing operations narrows the range of voltages over which processor 710 is allowed to operate at full performance. Overall, performance is reduced but processor 710 sees a more stable supply voltage.

Figure 11:
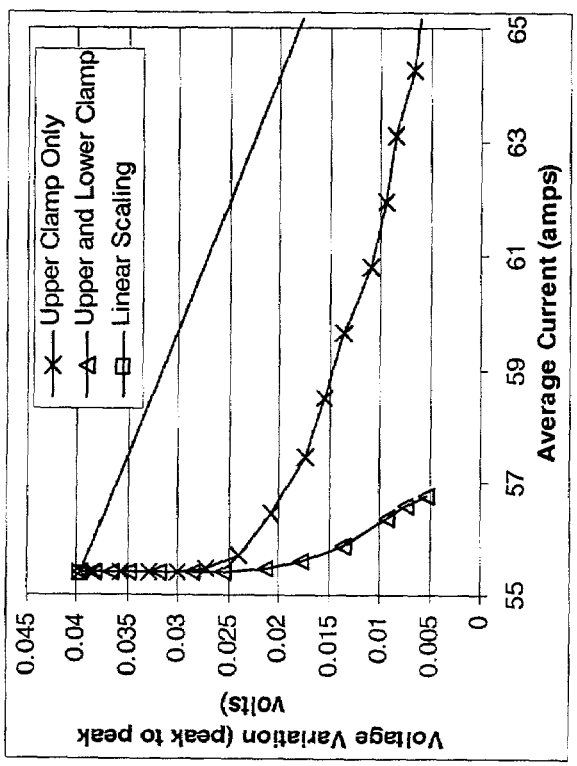
FIG. 11 represents a simulation of the supply voltage variation versus power as determined using a truncated convolution interval.

FIG. 11 represents simulations of the peak-to-peak voltage variation of a power delivery network for system 700 versus performance for three different intervals. It is evident from FIG. 11 that there is little difference in the results generated by the simulation for intervals of 25 (curve 1110), 43 (curve 1120) and 350 (curve 1130) clock cycles. In each instance, peak-to-peak voltage variation may be limited to approximately 1 mV with a performance reduction of less than 5%.

Figure 12:
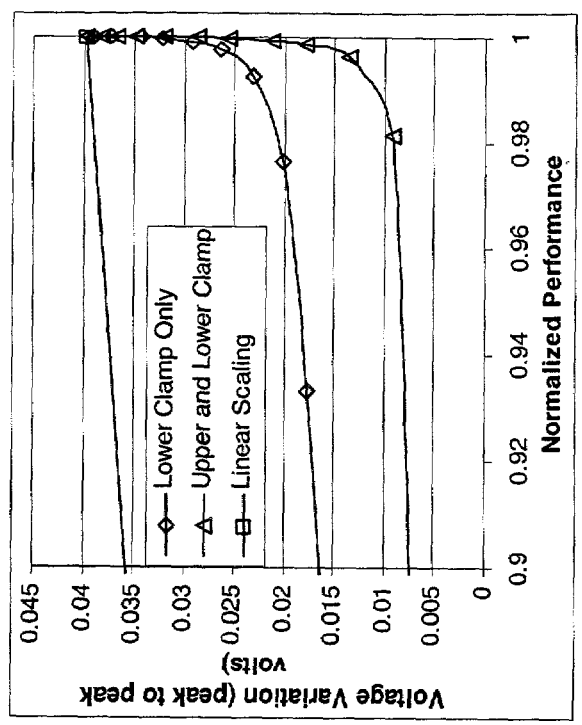
FIG. 12 represents a simulation of the supply voltage variation versus performance determined using a truncated convolution interval.

FIG. 12 represents simulations of the peak-to-peak voltage variation of a power delivery network for system 700 versus dissipated power for three different convolution intervals. The results are comparable for the three intervals, indicating that as few as 25 intervals are sufficient to provide practical di/dt control.

The latency of CCU 730 can have significant impact on its efficacy in controlling the voltage variations associated with di/dt swings. For example, it is apparent from FIG. 2 that the larger scale voltage variations in step and impulse responses 210 and 230, respectively, occur within the first few intervals of a current change. Consequently, an effective CCU 730 is designed to respond with low latency, e.g. 1 or 2 cycles. FIGS. 13 and 14 represent the dependence of peak-to-peak voltage variation on performance and power for CCUs having latencies of 1–4 clock cycles. It is apparent from these figures that much of the benefit of di/dt control disappears for latencies>2 clock cycles.

For the disclosed embodiment of CCU 730, the main sources of latency are ICU 812 and IVCU 814. As indicated above for FIR-based filters, reducing the size of the monitored interval helps. In this regard, IIR-based filters are likely to provide better results for a given latency. For example, simulations have shown that reasonable estimates of the voltage seen by the device may be obtained using second order IIR filters. A second order filter employs only three current coefficients ($a_0$, $a_1$, $a_2$) and two voltage coefficients ($b_0$, $b_1$), which compares very favorably with the 25 coefficients used by FIR filter 814'.

Other strategies may also be applied to reduce latency. For example, the current consumption for blocks later in the execution pipeline can be pre-computed at an earlier stage. If necessary, two computations can be performed at an early stage, and one selected later according to whether the relevant unit was active or inactive. In addition, for the disclosed embodiment of monitor circuit 820, only the first element of impulse response needs to be computed with one cycle latency. The second element may take two cycles, the third may take three cycles and so on.

Latency constraints also indicate that a single centralized CCU for, e.g. a processor, will not provide the same benefits as controlling di/dt in a distributed/local manner. For example, a local CCU can be built alongside the unit(s) whose activity it controls to respond faster to current variations in its assigned unit(s). A centralized CCU must await data from units distributed across the chip. If local CCUs are associated with different pipelines within a processor, some communication between pipelines will be necessary to ensure that data exchanged between pipelines does not get lost. For example, queues may be added between pipelines to buffer data from one pipeline that is destined for another pipelined that is momentarily stalled by its CCU.

There has thus been provided a mechanism for simulating the voltage seen by a device in a power delivery network. The mechanism may be used to study the efficacy of various strategies for mitigating di/dt-induced variations in this voltage. For one embodiment of the invention, an impulse response is determined for the power delivery network, and an activity profile for the device powered by the network is monitored during operation. The activity profile is then convoluted with the impulse response to provide a profile of the voltages at the device.

This and other embodiments, which have been provided to illustrate various features of the present invention, may be useful in modeling electronic systems such as computers and other processor-based systems that employ clock gating or are subject to significant di/dt variations for other reasons. Persons skilled in the art and having the benefit of this disclosure will recognize variations and modifications of the disclosed embodiments, which none the less fall within the spirit and scope of the appended claims.

What is claimed is:

1. A medium on which are stored instructions that may be executed by a machine to implement a method comprising:
   determining an impulse response of a power delivery network to a current pulse having a specified amplitude, the impulse response being represented as $1^{st}$ through $n^{th}$ impulse response amplitudes, corresponding to $1^{st}$ through $n^{th}$ time intervals relative to the current pulse;
   simulating operation of a device to determine $1^{st}$ through $m^{th}$ current pulses drawn by the device on m-successive time intervals, each current pulse being characterized by an amplitude and an offset interval;
   for each current pulse, scaling the $1^{st}$ through $n^{th}$ impulse response amplitudes by the amplitude of the current pulse and time-shifting the scaled $1^{st}$ through $n^{th}$ impulse response amplitudes according to the offset interval to provide $1^{st}$ through $n^{th}$ scaled impulse response amplitudes in $(1+\text{offset})^{th}$ through $(n+\text{offset})^{th}$ intervals, respectively.

2. The medium of claim 1, further comprising adding the scaled impulse amplitudes in each of a set of intervals to provide an estimated device-voltage for each interval of the set.

3. The medium of claim 2, wherein determining an impulse response comprises:
   determining a step response to a current step having the specified amplitude; and
   determining the impulse response from the step response.

4. The medium of claim 3, wherein determining the impulse response from the step response comprises determining a first derivative of the impulse response in each of the $1^{st}$ through $n^{th}$ intervals.

5. The medium of claim 1, wherein the device is a processor that operates responsive to a clock and the $1^{st}$ through $n^{th}$ intervals correspond to $1^{st}$ through $n^{th}$ clock cycles of the processor.

6. The medium of claim 5, wherein the processor is simulated as one or more units to which power delivery is controlled through an associated gate unit.

7. The medium of claim 6, wherein simulating operation of the processor to determine $1^{st}$ through $m^{th}$ current pulses comprises:
   identifying the units that are active in each of the $1^{st}$ through $m^{th}$ time intervals; and
   in each time interval, summing currents drawn by the units that are active in the time interval.

* * * * *